United States Patent
Upadhya et al.

(10) Patent No.: US 7,806,168 B2
(45) Date of Patent: Oct. 5, 2010

(54) OPTIMAL SPREADER SYSTEM, DEVICE AND METHOD FOR FLUID COOLED MICRO-SCALED HEAT EXCHANGE

(75) Inventors: Girish Upadhya, San Jose, CA (US); Richard Herms, Cupertino, CA (US); Peng Zhou, Albany, CA (US); Kenneth Goodson, Belmont, CA (US); James Hom, Redwood City, CA (US)

(73) Assignee: Cooligy Inc, Mountain View, CA (US)

( * ) Notice: Subject to any disclaimer, the term of this patent is extended or adjusted under 35 U.S.C. 154(b) by 1596 days.

(21) Appl. No.: 10/698,180

(22) Filed: Oct. 30, 2003

(65) Prior Publication Data

US 2004/0188066 A1 Sep. 30, 2004

Related U.S. Application Data

(60) Provisional application No. 60/423,009, filed on Nov. 1, 2002, provisional application No. 60/442,383, filed on Jan. 24, 2003, provisional application No. 60/455,729, filed on Mar. 17, 2003.

(51) Int. Cl.
*F28F 7/00* (2006.01)

(52) U.S. Cl. .................. 165/80.4; 165/104.33

(58) Field of Classification Search ............... 165/80.1, 165/80.2, 80.3, 80.4, 104.33; 422/129
See application file for complete search history.

(56) References Cited

U.S. PATENT DOCUMENTS

| | | | |
|---|---|---|---|
| 596,062 A | 12/1897 | Firey | |
| 2,039,593 A | 5/1936 | Hubbuch et al. | |
| 2,273,505 A | 2/1942 | Florian | |
| 3,361,195 A | 1/1968 | Meyerhoff et al. | |
| 3,654,988 A | 4/1972 | Clayton, III | |
| 3,771,219 A | 11/1973 | Tuzi et al. | |
| 3,800,510 A | 4/1974 | Lamond | |
| 3,817,321 A | 6/1974 | von Cube et al. | |
| 3,823,572 A | 7/1974 | Cochran, Jr. | |
| 3,852,806 A | 12/1974 | Corman et al. | 357/82 |
| 3,904,262 A | 9/1975 | Cutchaw | 339/17 |
| 3,923,426 A | 12/1975 | Theeuwes | |

(Continued)

FOREIGN PATENT DOCUMENTS

DE    42 42 841 A1    11/1997

(Continued)

OTHER PUBLICATIONS

Plattenwarmeubertrager, Die Bibliothek der Technik 105, published by "moderne industrie", 3$^{rd}$ edition, 2000, ISBN 3-478-93119-3, pp. 34-36.

(Continued)

*Primary Examiner*—Ljiljana (Lil) V Ciric
(74) *Attorney, Agent, or Firm*—Haverstock & Owens LLP

(57) ABSTRACT

A device, method, and system for a fluid cooled micro-scaled heat exchanger is disclosed. The fluid cooled micro-scaled heat exchanger utilizes a micro-scaled region and a spreader region with a highly thermally conductive material and sized to yield high heat dissipation and transfer area per unit volume from a heat source. The micro-scaled region preferably comprises microchannels.

91 Claims, 3 Drawing Sheets

U.S. PATENT DOCUMENTS

| | | | |
|---|---|---|---|
| 3,929,154 A | 12/1975 | Goodwin | |
| 3,948,316 A | 4/1976 | Souriau | |
| 4,109,707 A | 8/1978 | Wilson et al. | |
| 4,194,559 A | 3/1980 | Eastman | |
| 4,203,488 A | 5/1980 | Johnson et al. | |
| 4,211,208 A | 7/1980 | Lindner | |
| 4,235,285 A | 11/1980 | Johnson et al. | |
| 4,248,295 A | 2/1981 | Ernst et al. | |
| 4,296,455 A | 10/1981 | Leaycraft et al. | 361/383 |
| 4,312,012 A | 1/1982 | Frieser et al. | |
| 4,332,291 A | 6/1982 | Mulock-Bentley | 165/76 |
| 4,345,267 A | 8/1982 | Corman et al. | |
| 4,450,472 A | 5/1984 | Tuckerman et al. | |
| 4,467,861 A | 8/1984 | Kiseev et al. | |
| 4,474,172 A | 10/1984 | Burke | 126/449 |
| 4,485,429 A | 11/1984 | Mittal | |
| 4,494,171 A | 1/1985 | Bland et al. | 361/386 |
| 4,516,632 A | 5/1985 | Swift et al. | |
| 4,540,115 A | 9/1985 | Hawrylo | |
| 4,561,040 A | 12/1985 | Eastman et al. | |
| 4,567,505 A | 1/1986 | Pease et al. | |
| 4,568,431 A | 2/1986 | Polan et al. | 204/13 |
| 4,573,067 A | 2/1986 | Tuckerman et al. | |
| 4,574,876 A | 3/1986 | Aid | |
| 4,644,385 A | 2/1987 | Nakanishi et al. | |
| 4,664,181 A | 5/1987 | Sumberg | |
| 4,716,494 A | 12/1987 | Bright et al. | |
| 4,793,405 A | 12/1988 | Diggelmann et al. | 165/104.33 |
| 4,866,570 A | 9/1989 | Porter | |
| 4,868,712 A | 9/1989 | Woodman | |
| 4,884,331 A | 12/1989 | Hinshaw | 29/558 |
| 4,884,630 A | 12/1989 | Nelson et al. | |
| 4,893,174 A | 1/1990 | Yamada et al. | |
| 4,894,709 A | 1/1990 | Phillips et al. | |
| 4,896,719 A | 1/1990 | O'Neill et al. | |
| 4,903,761 A | 2/1990 | Cima | |
| 4,908,112 A | 3/1990 | Pace | |
| 4,938,280 A | 7/1990 | Clark | |
| 4,978,638 A | 12/1990 | Buller et al. | |
| 5,009,760 A | 4/1991 | Zare et al. | |
| 5,016,090 A | 5/1991 | Galyon et al. | |
| 5,016,138 A | 5/1991 | Woodman | |
| 5,043,797 A | 8/1991 | Lopes | |
| 5,057,908 A | 10/1991 | Weber | |
| 5,058,627 A | 10/1991 | Brannen | |
| 5,070,040 A | 12/1991 | Pankove | |
| 5,083,194 A | 1/1992 | Bartilson | |
| 5,088,005 A | 2/1992 | Ciaccio | |
| 5,096,388 A | 3/1992 | Weinberg | |
| 5,099,311 A | 3/1992 | Bonde et al. | |
| 5,099,910 A | 3/1992 | Walpole et al. | |
| 5,125,451 A | 6/1992 | Matthews | |
| 5,131,233 A | 7/1992 | Cray et al. | |
| 5,145,001 A | 9/1992 | Valenzuela | 165/164 |
| 5,161,089 A | 11/1992 | Chu et al. | |
| 5,179,500 A | 1/1993 | Koubek et al. | 361/385 |
| 5,199,487 A | 4/1993 | DiFrancesco et al. | 165/168 |
| 5,203,401 A | 4/1993 | Hamburgen et al. | |
| 5,218,515 A | 6/1993 | Bernhardt | |
| 5,219,278 A | 6/1993 | Van Lintel | |
| 5,228,502 A | 7/1993 | Chu et al. | |
| 5,232,047 A | 8/1993 | Matthews | |
| 5,239,200 A | 8/1993 | Messina et al. | |
| 5,239,443 A | 8/1993 | Fahey et al. | |
| 5,247,800 A | 9/1993 | Mruzek et al. | 62/51.1 |
| 5,263,251 A | 11/1993 | Matthews | |
| 5,265,670 A | 11/1993 | Zingher | |
| 5,269,372 A | 12/1993 | Chu et al. | |
| 5,274,920 A | 1/1994 | Matthews | |
| 5,275,237 A | 1/1994 | Rolfson et al. | |
| 5,285,347 A | 2/1994 | Fox et al. | 361/385 |
| 5,294,834 A | 3/1994 | Fatemi et al. | 257/745 |
| 5,299,635 A | 4/1994 | Abraham | 165/173 |
| 5,308,429 A | 5/1994 | Bradley | |
| 5,309,319 A | 5/1994 | Messina | |
| 5,310,440 A | 5/1994 | Zingher | |
| 5,316,077 A | 5/1994 | Reichard | |
| 5,317,805 A | 6/1994 | Hoopman et al. | |
| 5,325,265 A | 6/1994 | Turlik et al. | |
| 5,336,062 A | 8/1994 | Richter | |
| 5,346,000 A | 9/1994 | Schlitt | |
| 5,380,956 A | 1/1995 | Loo et al. | |
| 5,383,340 A | 1/1995 | Larson et al. | |
| 5,386,143 A | 1/1995 | Fitch | |
| 5,388,635 A | 2/1995 | Gruber et al. | |
| 5,397,919 A | 3/1995 | Tata et al. | |
| 5,421,943 A | 6/1995 | Tam et al. | |
| 5,427,174 A | 6/1995 | Lomolino, Sr. et al. | 165/1 |
| 5,436,793 A | 7/1995 | Sanwo et al. | |
| 5,459,099 A | 10/1995 | Hsu | |
| 5,490,117 A | 2/1996 | Oda et al. | |
| 5,508,234 A | 4/1996 | Dusablon, Sr. et al. | |
| 5,514,832 A | 5/1996 | Dusablon, Sr. et al. | |
| 5,514,906 A | 5/1996 | Love et al. | |
| 5,520,244 A * | 5/1996 | Mundinger et al. | 165/104.33 |
| 5,526,875 A | 6/1996 | Lin | 165/80.3 |
| 5,534,328 A | 7/1996 | Ashmead et al. | |
| 5,544,696 A | 8/1996 | Leland | |
| 5,548,605 A | 8/1996 | Benett et al. | |
| 5,564,497 A | 10/1996 | Fukuoka et al. | 165/152 |
| 5,575,929 A | 11/1996 | Yu et al. | |
| 5,579,828 A | 12/1996 | Reed et al. | |
| 5,585,069 A | 12/1996 | Zanzucchi et al. | |
| 5,641,400 A | 6/1997 | Kaltenbach et al. | |
| 5,658,831 A | 8/1997 | Layton et al. | |
| 5,675,473 A | 10/1997 | McDunn et al. | |
| 5,692,558 A | 12/1997 | Hamilton et al. | |
| 5,696,405 A | 12/1997 | Weld | |
| 5,703,536 A | 12/1997 | Davis et al. | |
| 5,704,416 A | 1/1998 | Larson et al. | |
| 5,726,495 A | 3/1998 | Aihara et al. | 257/722 |
| 5,727,618 A | 3/1998 | Mundinger et al. | |
| 5,731,954 A | 3/1998 | Cheon | 361/699 |
| 5,740,013 A | 4/1998 | Roesner et al. | |
| 5,759,014 A | 6/1998 | Van Lintel | |
| 5,763,951 A | 6/1998 | Hamilton et al. | |
| 5,768,104 A | 6/1998 | Salmonson et al. | |
| 5,800,690 A | 9/1998 | Chow et al. | |
| 5,801,442 A | 9/1998 | Hamilton et al. | |
| 5,810,077 A | 9/1998 | Nakamura et al. | 165/153 |
| 5,811,062 A * | 9/1998 | Wegeng et al. | 422/129 |
| 5,829,514 A | 11/1998 | Smith et al. | 165/78 |
| 5,835,345 A | 11/1998 | Staskus et al. | |
| 5,836,750 A | 11/1998 | Cabuz | |
| 5,858,188 A | 1/1999 | Soane et al. | |
| 5,863,708 A | 1/1999 | Zanzucchi et al. | |
| 5,869,004 A | 2/1999 | Parce et al. | |
| 5,870,823 A | 2/1999 | Bezama et al. | |
| 5,874,795 A | 2/1999 | Sakamoto | |
| 5,876,655 A | 3/1999 | Fisher | |
| 5,880,017 A | 3/1999 | Schwiebert et al. | |
| 5,880,524 A | 3/1999 | Xie | |
| 5,886,870 A | 3/1999 | Omori | |
| 5,901,037 A | 5/1999 | Hamilton et al. | |
| 5,921,087 A | 7/1999 | Bhatia et al. | |
| 5,936,192 A | 8/1999 | Tauchi | |
| 5,940,270 A | 8/1999 | Puckett | |
| 5,942,093 A | 8/1999 | Rakestraw et al. | |
| 5,945,217 A | 8/1999 | Hanrahan | |
| 5,964,092 A | 10/1999 | Tozuka et al. | |
| 5,965,001 A | 10/1999 | Chow et al. | |
| 5,965,813 A | 10/1999 | Wan et al. | |
| 5,978,220 A | 11/1999 | Frey et al. | |
| 5,993,750 A | 11/1999 | Ghosh et al. | |

| | | |
|---|---|---|
| 5,997,713 A | 12/1999 | Beetz, Jr. et al. |
| 5,998,240 A | 12/1999 | Hamilton et al. |
| 6,007,309 A | 12/1999 | Hartley |
| 6,010,316 A | 1/2000 | Haller et al. |
| 6,013,164 A | 1/2000 | Paul et al. |
| 6,019,165 A | 2/2000 | Batchelder |
| 6,019,882 A | 2/2000 | Paul et al. |
| 6,021,045 A | 2/2000 | Johnson |
| 6,034,872 A | 3/2000 | Chrysler et al. |
| 6,039,114 A | 3/2000 | Becker et al. |
| 6,054,034 A | 4/2000 | Soane et al. |
| 6,068,752 A | 5/2000 | Dubrow et al. |
| 6,084,178 A | 7/2000 | Cromwell ............ 174/35 |
| 6,086,330 A | 7/2000 | Press et al. .......... 416/223 R |
| 6,090,251 A | 7/2000 | Sundberg et al. |
| 6,096,656 A | 8/2000 | Matzke et al. |
| 6,100,541 A | 8/2000 | Nagle et al. |
| 6,101,715 A * | 8/2000 | Fuesser et al. ...... 165/104.33 |
| 6,105,373 A | 8/2000 | Watanabe et al. ......... 62/3.7 |
| 6,119,729 A | 9/2000 | Oberholzer et al. |
| 6,126,723 A | 10/2000 | Drost et al. |
| 6,129,145 A | 10/2000 | Yamamoto et al. |
| 6,129,260 A | 10/2000 | Andrus et al. |
| 6,131,650 A | 10/2000 | North et al. ........... 165/170 |
| 6,140,860 A | 10/2000 | Sandhu et al. |
| 6,146,103 A | 11/2000 | Lee et al. |
| 6,154,363 A | 11/2000 | Chang |
| 6,159,353 A | 12/2000 | West et al. |
| 6,166,907 A | 12/2000 | Chien ................... 361/699 |
| 6,167,948 B1 | 1/2001 | Thomas |
| 6,171,067 B1 | 1/2001 | Parce |
| 6,174,675 B1 | 1/2001 | Chow et al. |
| 6,176,962 B1 | 1/2001 | Soane et al. |
| 6,186,660 B1 | 2/2001 | Kopf-Sill et al. |
| 6,196,307 B1 | 3/2001 | Ozmat .................. 165/185 |
| 6,206,022 B1 | 3/2001 | Tsai et al. |
| 6,210,986 B1 | 4/2001 | Arnold et al. |
| 6,216,343 B1 | 4/2001 | Leland et al. |
| 6,221,226 B1 | 4/2001 | Kopf-Sill |
| 6,227,287 B1 | 5/2001 | Tanaka et al. ......... 165/80.4 |
| 6,227,809 B1 | 5/2001 | Forster et al. |
| 6,234,240 B1 | 5/2001 | Cheon |
| 6,238,538 B1 | 5/2001 | Parce et al. |
| 6,253,832 B1 | 7/2001 | Hallefalt |
| 6,253,835 B1 | 7/2001 | Chu et al. |
| 6,257,320 B1 | 7/2001 | Wargo |
| 6,272,012 B1 | 8/2001 | Medin et al. ........... 361/690 |
| 6,277,257 B1 | 8/2001 | Paul et al. |
| 6,287,440 B1 | 9/2001 | Arnold et al. |
| 6,293,333 B1 | 9/2001 | Ponnappan et al. |
| 6,301,109 B1 | 10/2001 | Chu et al. |
| 6,313,992 B1 | 11/2001 | Hildebrandt |
| 6,317,326 B1 | 11/2001 | Vogel et al. |
| 6,321,791 B1 | 11/2001 | Chow |
| 6,322,753 B1 | 11/2001 | Lindberg et al. |
| 6,324,058 B1 | 11/2001 | Hsiao |
| 6,324,075 B1 | 11/2001 | Unrein et al. ........... 361/816 |
| 6,330,907 B1 | 12/2001 | Ogushi et al. |
| 6,336,497 B1 | 1/2002 | Lin |
| 6,337,794 B1 | 1/2002 | Agonafer et al. |
| 6,347,036 B1 | 2/2002 | Yeager et al. |
| 6,351,384 B1 | 2/2002 | Daikoku et al. |
| 6,360,814 B1 | 3/2002 | Tanaka et al. ........ 165/104.33 |
| 6,366,462 B1 | 4/2002 | Chu et al. |
| 6,366,467 B1 | 4/2002 | Patel et al. |
| 6,367,544 B1 | 4/2002 | Calaman |
| 6,381,846 B2 | 5/2002 | Insley et al. ......... 29/890.039 |
| 6,385,044 B1 | 5/2002 | Colbert et al. ........... 361/700 |
| 6,388,317 B1 | 5/2002 | Reese |
| 6,396,706 B1 | 5/2002 | Wohlfarth ............... 361/760 |
| 6,397,932 B1 | 6/2002 | Calaman et al. |
| 6,400,012 B1 | 6/2002 | Miller et al. |
| 6,406,605 B1 | 6/2002 | Moles |
| 6,415,860 B1 | 7/2002 | Kelly et al. |
| 6,416,642 B1 | 7/2002 | Alajoki et al. |
| 6,417,060 B2 | 7/2002 | Tavkhelidze et al. |
| 6,424,531 B1 | 7/2002 | Bhatti et al. |
| 6,431,260 B1 | 8/2002 | Agonafer et al. |
| 6,437,981 B1 | 8/2002 | Newton et al. |
| 6,438,984 B1 | 8/2002 | Novotny et al. |
| 6,443,222 B1 | 9/2002 | Yun et al. |
| 6,444,461 B1 | 9/2002 | Knapp et al. |
| 6,449,157 B1 | 9/2002 | Chu |
| 6,449,162 B1 | 9/2002 | Corbin, Jr. et al. |
| 6,457,515 B1 | 10/2002 | Vafai et al. |
| 6,459,581 B1 | 10/2002 | Newton et al. |
| 6,459,582 B1 | 10/2002 | Ali et al. |
| 6,466,442 B2 | 10/2002 | Lin |
| 6,469,893 B1 | 10/2002 | Frutschy et al. ............ 361/700 |
| 6,477,045 B1 | 11/2002 | Wang |
| 6,478,258 B1 | 11/2002 | Yee ......................... 244/163 |
| 6,492,200 B1 | 12/2002 | Park et al. |
| 6,495,015 B1 | 12/2002 | Schoeniger et al. |
| 6,508,301 B2 | 1/2003 | Marsala .................. 165/80.4 |
| 6,519,151 B2 | 2/2003 | Chu et al. |
| 6,527,835 B1 * | 3/2003 | Manginell et al. ........ 73/204.26 |
| 6,533,029 B1 | 3/2003 | Phillips |
| 6,533,840 B2 | 3/2003 | Martin et al. |
| 6,536,510 B2 | 3/2003 | Khrustalev et al. ...... 165/104.33 |
| 6,536,516 B2 | 3/2003 | Davies et al. |
| 6,537,437 B1 | 3/2003 | Galambos et al. |
| 6,543,521 B1 | 4/2003 | Sato et al. |
| 6,553,253 B1 | 4/2003 | Chang |
| 6,572,749 B1 | 6/2003 | Paul et al. |
| 6,578,626 B1 | 6/2003 | Calaman et al. |
| 6,581,388 B2 | 6/2003 | Novotny et al. |
| 6,587,343 B2 | 7/2003 | Novotny et al. |
| 6,588,498 B1 | 7/2003 | Reyzin et al. |
| 6,591,625 B1 | 7/2003 | Simon |
| 6,600,220 B2 | 7/2003 | Barber et al. |
| 6,601,643 B2 | 8/2003 | Cho et al. |
| 6,606,251 B1 | 8/2003 | Kenny, Jr. et al. |
| 6,609,560 B2 | 8/2003 | Cho et al. |
| 6,632,655 B1 | 10/2003 | Mehta et al. |
| 6,632,719 B1 | 10/2003 | DeBoer et al. ............ 438/381 |
| 6,643,132 B2 | 11/2003 | Faneuf et al. ............ 361/700 |
| 6,651,735 B2 | 11/2003 | Cho et al. |
| 6,657,121 B2 | 12/2003 | Garner .................... 174/16.3 |
| 6,679,315 B2 | 1/2004 | Cosley et al. ............ 165/80.4 |
| 6,700,785 B2 | 3/2004 | Berry et al. .............. 361/726 |
| 6,729,383 B1 | 5/2004 | Cannell et al. |
| 6,743,664 B2 | 6/2004 | Liang et al. |
| 6,757,169 B2 | 6/2004 | Kondo et al. ............ 361/699 |
| 6,763,880 B1 | 7/2004 | Shih ........................ 165/80.4 |
| 6,787,052 B1 | 9/2004 | Vaganov .................... 216/57 |
| 6,795,312 B2 | 9/2004 | Narakino et al. .......... 361/687 |
| 6,796,372 B2 | 9/2004 | Bear ........................ 165/104.21 |
| 6,807,056 B2 | 10/2004 | Kondo et al. ............ 361/689 |
| 6,826,922 B2 | 12/2004 | Patel et al. .................. 62/185 |
| 6,829,142 B2 | 12/2004 | Belady et al. ............ 361/687 |
| 6,836,131 B2 | 12/2004 | Cader et al. .............. 324/760 |
| 6,863,117 B2 | 3/2005 | Valenzuela |
| 6,881,039 B2 | 4/2005 | Corbin et al. |
| 6,882,543 B2 | 4/2005 | Kenny, Jr. et al. |
| 6,942,018 B2 | 9/2005 | Goodson et al. .......... 165/80.4 |
| 6,967,842 B2 | 11/2005 | Aoki et al. ................ 361/701 |
| 6,986,382 B2 | 1/2006 | Upadhya et al. .......... 165/80.4 |
| 6,988,534 B2 | 1/2006 | Kenny et al. |
| 6,988,535 B2 | 1/2006 | Upadhya et al. |
| 6,992,891 B2 | 1/2006 | Mallik et al. ............... 361/704 |
| 6,994,151 B2 | 2/2006 | Zhou et al. |
| 7,000,684 B2 * | 2/2006 | Kenny et al. ............. 165/80.4 |
| 7,009,843 B2 | 3/2006 | Lee et al. .................. 361/704 |
| 7,017,654 B2 | 3/2006 | Kenny et al. |
| 7,019,973 B2 | 3/2006 | Rivera |
| 7,021,012 B2 | 4/2006 | Zeng et al. |

| | | |
|---|---|---|
| 7,021,369 B2 | 4/2006 | Werner et al. |
| 7,044,196 B2 | 5/2006 | Shook et al. |
| 7,050,308 B2 | 5/2006 | Kenny, Jr. et al. |
| 7,061,104 B2 | 6/2006 | Kenny, Jr. et al. |
| 7,077,634 B2 | 7/2006 | Munch et al. |
| 7,086,839 B2 | 8/2006 | Kenny et al. |
| 7,090,001 B2 | 8/2006 | Zhou et al. |
| 7,104,312 B2 | 9/2006 | Goodson et al. |
| 7,120,021 B2 | 10/2006 | Hamman ............ 361/699 |
| 7,154,749 B2 | 12/2006 | Stefanoski et al. ......... 361/695 |
| 7,184,269 B2 | 2/2007 | Campbell et al. .......... 361/700 |
| 7,188,662 B2 | 3/2007 | Brewer et al. |
| 7,201,214 B2 | 4/2007 | Munch et al. |
| 7,243,704 B2 | 7/2007 | Tustaniwskyi et al. ..... 165/80.2 |
| 7,254,957 B2 | 8/2007 | Weber et al. ............. 62/259.2 |
| 7,278,549 B2 | 10/2007 | Munch et al. |
| 7,293,423 B2 | 11/2007 | Upadhya et al. |
| 7,301,773 B2 | 11/2007 | Brewer et al. |
| 7,334,630 B2 | 2/2008 | Goodson et al. ....... 165/104.33 |
| 7,344,363 B2 | 3/2008 | Munch et al. |
| 7,402,029 B2 | 7/2008 | Munch et al. |
| 7,449,122 B2 | 11/2008 | Corbin et al. |
| 7,455,103 B2 | 11/2008 | Sato et al. ................ 165/299 |
| 7,462,852 B2 | 12/2008 | Appleby et al. |
| 2001/0016985 A1 | 8/2001 | Insley et al. |
| 2001/0024820 A1 | 9/2001 | Mastromatteo et al. |
| 2001/0044155 A1 | 11/2001 | Paul et al. |
| 2001/0045270 A1 | 11/2001 | Bhatti |
| 2001/0046703 A1 | 11/2001 | Burns et al. |
| 2001/0055714 A1 | 12/2001 | Cettour-Rose et al. |
| 2002/0011330 A1 | 1/2002 | Insley et al. |
| 2002/0031948 A1 | 3/2002 | Yasufuku et al. ............ 439/625 |
| 2002/0075645 A1 | 6/2002 | Kitano et al. |
| 2002/0121105 A1 | 9/2002 | McCarthy, Jr. et al. |
| 2002/0134543 A1 | 9/2002 | Estes et al. ................ 165/277 |
| 2002/0152761 A1 | 10/2002 | Patel et al. ................ 62/259.2 |
| 2002/0160245 A1 | 10/2002 | Genc ........................ 429/26 |
| 2003/0062149 A1 | 4/2003 | Goodson et al. |
| 2003/0097846 A1 | 5/2003 | Novotny et al. ............. 62/3.7 |
| 2003/0121274 A1 | 7/2003 | Wightman |
| 2003/0213580 A1 | 11/2003 | Philpott et al. |
| 2004/0008483 A1 | 1/2004 | Cheon ........................ 361/687 |
| 2004/0040695 A1 | 3/2004 | Chesser et al. |
| 2004/0050231 A1 | 3/2004 | Chu et al. ..................... 83/574 |
| 2004/0052049 A1 | 3/2004 | Wu et al. |
| 2004/0057211 A1 | 3/2004 | Kondo et al. ............... 361/696 |
| 2004/0089008 A1 | 5/2004 | Tilton et al. |
| 2004/0099410 A1 | 5/2004 | Ghosh ........................ 165/185 |
| 2004/0112571 A1 | 6/2004 | Kenny et al. ............... 165/80.3 |
| 2004/0112585 A1 | 6/2004 | Goodson et al. ............ 165/299 |
| 2004/0125561 A1 | 7/2004 | Gwin et al. |
| 2004/0160741 A1 | 8/2004 | Moss et al. |
| 2004/0188069 A1 | 9/2004 | Tomioka et al. |
| 2004/0188076 A1 | 9/2004 | Lee ............................. 165/80.4 |
| 2004/0206477 A1 | 10/2004 | Kenny et al. ............... 165/80.4 |
| 2004/0216863 A1 | 11/2004 | Hu ............................. 165/110 |
| 2004/0221604 A1 | 11/2004 | Ota et al. ................... 62/259.2 |
| 2005/0082666 A1 | 4/2005 | Lee et al. ................... 257/728 |
| 2005/0083657 A1 | 4/2005 | Hamman ................... 361/699 |
| 2005/0117298 A1 | 6/2005 | Koga et al. ................. 361/699 |
| 2005/0133200 A1 | 6/2005 | Malone et al. ............. 165/80.4 |
| 2005/0168949 A1 | 8/2005 | Tilton et al. ................ 361/699 |
| 2005/0247433 A1 | 11/2005 | Corrado et al. ............ 165/80.4 |
| 2005/0257532 A1 | 11/2005 | Ikeda et al. ................... 62/3.7 |
| 2005/0259393 A1 | 11/2005 | Vinson et al. .............. 361/690 |
| 2006/0037739 A1 | 2/2006 | Utsunomiya .......... 165/104.33 |
| 2006/0060333 A1 | 3/2006 | Chordia et al. ......... 165/104.33 |
| 2006/0133039 A1 | 6/2006 | Belady ...................... 361/699 |
| 2006/0137863 A1 | 6/2006 | Lee et al. ............... 165/104.33 |
| 2006/0139882 A1 | 6/2006 | Mikubo et al. ............. 361/699 |
| 2006/0161311 A1 | 7/2006 | Vinson et al. .............. 700/300 |
| 2006/0187639 A1 | 8/2006 | Carswell ................... 361/699 |
| 2007/0115634 A1 | 5/2007 | Laing ........................ 361/699 |
| 2008/0013283 A1 | 1/2008 | Gilbert et al. .............. 361/715 |

FOREIGN PATENT DOCUMENTS

| | | |
|---|---|---|
| DE | 197 10 716 C2 | 9/1998 |
| EP | 1 154476 A1 | 11/2001 |
| EP | 1 520 993 A2 | 6/2005 |
| JP | 64-024447 | 1/1989 |
| JP | 1-256775 | 10/1989 |
| JP | 10-99592 | 4/1998 |
| JP | 2001-326311 | 11/2001 |
| JP | 410223811 A | 8/2008 |
| TW | 516810 | 1/2003 |
| WO | WO 01/25711 A1 | 4/2001 |

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059-2063.

Kendra V. Sharp et al., "Liquid Flows in Microchannels", 2002, vol. 6, pp. 6-1 to 6-38.

Shuchi Shoji et al., "Microflow devices and systems", J. Microcech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical, Vo. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packages, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromaching", Sep. 1999, Microfluidic Devices and Systems II, vol. 3877, pp. 267-272.

G. Mohiuddin Mala et al., "Heat transfer and fluid flow in microchannels", 1997, Int. J. Mass transfer, vol. 40, No. 13, pp. 3079-3088, printed in Great Britain.

J. M. Cuta et al., "Fabrication and Testing of Micro-Channel Heat Exchangers", SPIE Microlithography and Metrology in Micromaching, vol. 2640, 1995, pp. 152-160.

Linan Jiang et al., "A Micro-Channel Heat Sink with Integrated Temperature Sensors for Phase Transition Study", 1999, 12th IEEE International Conference on Micro Electro Mechanical Systems, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yongendra Joshi, "Heat out of small packages", Dec. 2001, Mechanical Engineer, pp. 56-58.

A. Rostami et al., "Liquid Flow and Heat Transfer in Microchannels: a Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000) pp. 787-790.

J. C. Y. Koh et al., "Heat Transfer of Microstructure for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloid and Surfaces A: Physiocochemical and Engineering Aspects 161 (2000), pp. 89-102.

Jeffery D. Barner et al., "Thermal Ink Jet Print Head Carriage with Integral Liquid Cooling Capabilities",Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Process with Valves Operated by Pressure form Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellow Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

N. P. Bailey et al., "Cooling Device for Controlled Rectifier", IBM Technical Disclosure Bulletin, vol. 21, No. 11, Apr. 1979, pp. 4609-4610.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold et al., "Heat Sink Design for Cooling Modules in a Forced Air Environment", IBM Technical Disclosure Bulletin, vol. 22, No. 6, Nov. 1979, pp. 2297-2298.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Crititical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55-56.

"Self-Contained Active Heat Dissipation Device", IBM Technical Disclosure Bulletin vol. 39, No. 04, Apr. 1996, pp. 115-116.

C. J. Keller et al., "Jet Cooling Cup for Cooling Semiconductor Devices", IBM Technical Disclosure Bulletin, vol. 20, No. 9, Feb. 1978, pp. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

A. L. Pacuzzo et al., "Integrated Circuit Module Package Cooling Structure", IBM Technical Disclosure Bulletin, vol. 20, No. 10, Mar. 1978, pp. 3898-3899.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334-4335.

A. J. Arnold, "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755-2756.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305-306.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, p. 129-130.

"Means of Removing More Heat From a TCM (Or Other Liquid-Cooled Logic Package) By Reducing the Coolant Temperature", IBM Technical Disclosure Bulletin, vol. 32 No. 5A, Oct. 1989, pp. 153-154.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al."Method of Effective Cooling of a High Power Silicon Chip", IBM Technical Disclosure Bulletin, vol. 20, No. 4, Sep. 1977, p. 1436-1437.

V. Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosre Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362-367.

Jaisree Moorthy et al., *Active control of electroosmotic flow in microchannels using light*, Jan. 26, 2001, Sensors and Actuators B 75, pp. 223-229.

Andreas Manz et al., *Electroosmotic pumping, and electrophoretic separations for miniaturized chemical analysis systems*, Sep. 16, 1994, J.Micromech. Microeng. 4 (1994), pp. 257-265, printed in the U.K.

E. B. Cummings et al., *Irrotationality of uniform elctroosmosis*, Sep. 1999, Part of the SPIE Conference on Microfluidic Devices and Systems II, SPIE vol. 3877, pp. 180-189.

Stephen C. Jacobson et al., *Fused Quartz Substrates for Microchip Electrophoresis*, Jul. 1, 1995, Analytical Chemistry, vol. 67, No. 13, pp. 2059-2063.

Haim H. Bau, *Optimization of conduits' shape in micro heat exchangers*, Dec. 10, 1997, International Journal of Heat and Mass Transfer 41 (1998), pp. 2717-2723.

V. K. Dwivedi et al., *Fabrication of very smooth walls and bottoms of silicon microchannels for heat dissipation of semiconductor devices*, Jan. 25, 2000, Microelectronics Journal 31 (2000), pp. 405-410.

M. B. Bowers et al.,, *Two-Phase Electronic Cooling Using Mini-Channel and Micro-Channel Heat Sinks: Part 2—Flow Rate and Pressure Drop Constraints*, Dec. 1994, Journal of Electronic Packaging 116, pp. 298-305.

Meint J. de Boer et al., *Micromachining of Buried Micro Channels in Silicon*, Mar. 2000, Journal of Microelectromechanical systems, vol. 9, No. 1, pp. 94-103.

S.B. Choi et al., *Fluid Flow and Heat Transfer in Microtubes*, 1991, DSC-vol. 21, Micromechanical sensors, Actuators, and Systems, ASME 1991, pp. 123-134.

S. F. Choquette, M. Faghri et al., *Optimum Design of Microchannel Heat Sinks*, 1996, DSC-vol. 59, Microelectromechanical Systems (MEMS), ASME 1996, pp. 115-126.

David Copeland et al., *Manifold Microchannel Heat Sinks: Theory and Experiment*, 1995, EEP-vol. 10-2, Advances in Electronic Packaging ASME 1995, pp. 829-835.

J. M. Cuta et al., *Forced Convection Heat Transfer in Parallel Channel Array Microchannel Heat Exchanger*, 1996, PID-vol. 2 / HTD-vol. 338, Advances in Energy efficiency, Heat/Mass Transfer Enhancement, ASME 1996, pp. 17-23.

K. Fushinobu et al., *Heat Generation and Transport in Sub-Micron Semiconductor Devices*, 1993, HTD-vol. 253, Heat Transfer on the Microscale, ASME 1993, pp. 21-28.

Charlotte Gillot et al., *Integrated Micro Heat Sink for Power Multichip Module*, Sep. 3, 1999, IEEE Transactions on Industry Applications, vol. 36, No. 1. Jan./Feb. 2000, pp. 217-221.

John Gooding, *Microchannel heat exchangers—a review*, SPIE vol. 1997 High Heat Flux Engineering II (1993), pp. 66-82.

Koichiro Kawano et al., *Micro Channel Heat Exhanger for Cooling Electrical Equipment*, HTD-vol 361-/PID-vol. 3, Proceeding of the ASME Heat Transfer Division—vol. 3, ASME 1998, pp. 173-188.

Chad Harris et al., *Design and Fabrication of a Cross Flow Micro Heat Exchanger*, Dec. 2000, Journal of Microelectromechanical Systems, vol. 9, No. 4, pp. 502-508.

George M. Harpole et al., *Micro-Channel Heat Exchanger Optimization*, 1991, Seventh IEEE SEMI-THERM Symposium, pp. 59-63.

Pei-Xue Jiang et al., *Thermal-hydraulic performance of small scale micro-channel and prous-media heat-exchangers*, 2001, International Journal of Heat and Mass Transfer 44 (2001), pp. 1039-1051.

X.N. Jiang et al., *Laminar Flow Through Microchannels Used for Microscale Cooling Systems*, 1997, IEEE/CPMT Electronic Packaging Technology Conference, pp. 119-112, Singapore.

David Bazeley Tuckerman, *Heat-Transfer Microstructures for Integrated Circuits*, Feb. 1984, pp. ii-xix, pp. 1-141.

M Esashi, *Silicon micromachining for integrated microsystems*, 1996, Vacuum/vol. 47/Nos. 6-8/pp. 469-474.

T.S. Raviguruajan et al., *Effects of Heat Flux on Two-Phase Flow characteristics of Refrigerant Flows in a Micro-Channel Heat Exchanger*, HTD-vol. 329, National Heat Transfer Conference, vol. 7, ASME 1996, pp. 167-178.

T.S. Ravigruruajan et al., *Single-Phase Flow Thermal Performance Characteristics of a Parallel Micro-Channel Heat Exchanger*, 1996, HTD-vol. 329, National Heat Transfer Conference, vol. 7, ASME 1996, pp. 157-166.

T.S. Ravigururajan et al., *Liquid Flow Characteristic in a Diamond-Pattern Micro-Heat-Exchanger*, DSC-vol. 59 Microelectromechanical Systems (IMEMS), ASME 1996, pp. 159-166.

T.S. Raviguruajan, *Impact of Channel Geometry on Two-Phase Flow Heat Transfer Characteristics of Refrigerants in Microchannel Heat Exchangers*, May 1998, Journal of Heat Transfer, vol. 120, pp. 485-491.

J. Pfahler et al., *Liquid Transport in Micron and Submicron Channels*, Mar. 1990, Sensors and Actuators, A21-A23 (1990), pp. 431-434.

Kenneth Pettigrew et al., *Performance of a MEMS based Micro Capillary Pumped Loop for Chip-Level Temperature Control*, 2001, The 14$^{th}$ IEEE International Conference on Micro Electro Mechanical Systems, pp. 427-430.

C. Perret et al., *Microchannel integrated heat sinks in silicon technology*, Oct. 12-15, 1998, The 1998 IEEE Industry Applications Conference, pp. 1051-1055.

X.F. Peng et al., *Convective heat transfer and flow friction for water flow in microchannel structures*, 1996, Int. J. Heat Mass Transfer, vol. 39, No. 12, pp. 2599-2608, printed in Great Britain.

X.F. Peng et al., *Experimental investigation of heat transfer in flat plates with rectangular microchannels*, 1994, Int. J. Heat Mass Transfer, vol. 38, No. 1, pp. 127-137, printed in Great Britain.

X.F. Peng et al., *Cooling Characteristics with Microchanneled Structures*, 1994, Enhanced Heat Transfer, vol. 1, No. 4, pp. 315-326, printed in the United States of America.

Yoichi Murakami et al., *Parametric Optimization of Multichananneled Heat Sinks for VLSI Chip Cooling*, Mar. 2002, IEEE Transaction on Components and Packaging Technologies, vol. 24, No. 1, pp. 2-9.

D. Mundinger et al., *High average power 2-D laser diode arrays or silicon microchannel coolers*, CLEO '89/Friday Morning/404.

L.J. Missaggia et al., *Microchannel Heat Sinks for Two-Dimensional High-Power-Density Diode Laser Arrays*, 1989, IEEE Journal of Quantum Electronics, vol. 25, No. 9, Sep. 1989, pp. 1989-1992.

M.J. Marongiu et al., *Enhancement of Multichip Modules (MCMs) Cooling by Incorporating MicroHeatPipes and Other High Thermal Conductivity Materials into Microchannel Heat Sinks*, 1998, Electronic Components and Technology Conference, pp. 45-50.

C.R. Friedrich et al., *Micro heat exchangers fabricated by diamond machining*, Jan. 1994, Precision Engineering, vol. 16, No. 1, pp. 56-59.

Mali Mahalingam, *Thermal Management in Semiconductor Device Packaging*, 1985, Proceedings of the IEEE, vol. 73, No. 9, Sep. 1985, pp. 1396-1404.

T.M. Adams et al., *An experimental investigation of single-phase forced convection in microchannels*, 1997, Int. J. Heat Mass Transfer, vol. 41, Nos. 6-7, pp. 851-857, Printed in Great Britain.

T.M. Adams et al., *Applicability of traditional turbulent single-phase forced convection correlations to non-circular micrhchannels*, 1999, Int. J. Heat and Transfer 42 (1999) pp. 411-4415.

Bassam Badran et al., *Experimental Results for Low-Temperature Silicon Micromachined Micro Heat Pipe Arrays Using Water and Methanol as Working Fluids*, May 31, 1997, Experimental Heat Transfer, 10: pp. 253-272.

D. Jed Harrison et al., *Electroosmotic Pumping Within A Chemical Sensor System Integrated on Silicon*, Session C9 Chemical Sensors and Systems for Liquids, Jun. 26, 1991, pp. 792-795.

Kurt Seller et al., *Electroosmotic Pumping and Valveless Control of Fluid Flow within a Manifold of Capillaries on a Glass Chip*, 1994, Analytical Chemistry, vol. 66, No. 20, Oct. 15, 1994, pp. 3485-3491.

Philip H. Paul et al., *Electrokinetic Generation of High Pressures Using Porous Microstructures*, 1998, Micro-Total Analysis Systems, pp. 49-52.

Gh. Mohiuddin Mala et al., *Flow characteristics of water through a microchannel between two parallel plates with electrokinetic effects*, 1997, Int. J. Heat and Fluid Flow, vol. 18, No. 5, pp. 489-496.

W.E. Morf et al., *Partial electroosmotic pumping in complex capillary systems Part 1: Principles and general theoretical approach*, Oct. 16, 2000, Sensors and Actuators B 72 (2001), pp. 266-272.

M. Esashi, *Silicon micromachining and micromachines*, Sep. 1, 1993, Wear, vol. 168, No. 1-2, (1993), pp. 181-187.

Stephanus Buttgenbach et al., *Microflow devices for miniaturized chemical analysis systems*, Nov. 4-5, 1998, SPIE-Chemical Microsensors and Applications, vol. 3539, pp. 51-61.

Sarah Arunlanandam et al., *Liquid transport in rectangular microchannels by electroosmotic pumping*, 2000, Colloids and Surfaces A: Physicochemical and Engineering Aspects vol. 161 (2000), pp. 89-102.

Linan Jiang et al., *Closed-Loop Electroosmotic Microchannel Cooling System for VLSI Circuits*, Mechanical Engineering Dept. Stanford University, pp. 1-27.

Susan L. R. Barker et al., *Fabrication, Derivatization and Applications of Plastic Microfluidic Devices*, Proceedings of SPIE, vol. 4205. Nov. 5-8, 2000, pp. 112-118.

Timothy E. McKnight et al., *Electroosmotically Induced Hydraulic Pumping with Integrated Electrodes on Microfluidic Devices*, 2001, Anal. Chem., vol. 73, pp. 4045-4049.

Chris Bourne, *Cool Chips plc Receives Nanotech Manufacturing Patent*, Jul. 31, 2002, pp. 1-2.

Frank Wagner et al., *Electroosmotic Flow Control in Micro Channels Produced by Scanning Excimer Laser Ablation*, 2000, Proceedings of SPIE vol. 4088, Jun. 14-16, 2000, pp. 337-340.

H. A. Goodman, *Data Processor Cooling With Connection To Maintain Flow Through Standby Pump*, Dec. 1983, IBM Technical Disclosure Bulletin, vol. 26, No. 7A, p. 3325.

*Electroerosion Micropump*, May 1990, IBM Technical Disclosure Bulletin, vol. 32, No. 12, pp. 342-343.

Shulin Zeng et al., *Fabrication and Characterization of Electrokinetic Micro Pumps*, Inter Society Conference on Thermal Phenomena, pp. 31-35.

A. Manz et al., *Integrated Electroosmotic Pumps and Flow Manifolds for Total Chemical Analysis System*, Inter. Conf. on Solid-State Sensors and Actuators, pp. 939-941.

O. T. Guenat et al., *Partial electroosmotic pumping in complex capillary systems Part: 2 Fabrication and application of a micro total analysis system suited for continuous volumetric nanotitrations*, Oct. 16, 2000, Sensors and Actuators B 72 (2001) pp. 273-282.

J. G. Sunderland, *Electrokinetic dewatering and thickening. I. Introduction and historical review of electrokinetic applications*, Sep. 1987, Journal of Applied Electrochemistry vol. 17, No. 5, pp. 889-898.

J. C. Rife et al., *Acousto- and electroosmotic microfluidic controllers*, 1998, Microfluidic Devices and Systems, vol. 3515, pp. 125-135.

Purnendu K Dasgupta et al., *Electroosmosis: A Reliable Fluid Propulsion System for Flow Injection Analysis*, 1994, Anal. Chem., vol. 66, No. 11, pp. 1792-1798.

Ray Beach et al., *Modular Microchannel Cooled Heatsinks for High Average Power Laser Diode Arrays*, Apr. 1992, IEEE Journal of Quantum Electronics, vol. 28, No. 4, pp. 966-976.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754-760.

Y. Zhuang et al., *Experimental study on local heat transfer with liquid impingement flow in two-dimensional micro-channels*, 1997, Int. J. Heat Mass Transfer, vol. 40, No. 17, pp. 4055-4059.

D. Yu et al., *An Experimental and Theoretical Investigation of Fluid Flow and Heat Transfer in Microtube*, 1995, ASME / JSME Thermal Engineering Conference, vol. 1, pp. 523-530.

Xiaoqing Yin et al., *Micro Heat Exchangers Consisting of Pin Arrays*, 1997, Journal of Electronic Packaging Mar. 1997, vol. 119, pp. 51-57.

X. Yin et al., *Uniform Channel Micro Heat Exchangers*, 1997, Journal of Electronic Packaging Jun. 1997, vol. 119, No. 2, pp. 89-94.

Chun Yang et al., *Modeling forced liquid convection in rectangular microchannels with electrokinetic effect*, 1998, International Journal of Heat and Mass Transfer 41 (1998), pp. 4229-4249.

Arel Weisberg et al., *Analysis of microchannels for integrated cooling*, 1992, Int. J. Heat Mass Transfer, vol. 35, No. 10, pp. 2465-2473.

Roger S. Stanley et al., *Two-Phase Flow in Microchannels*, 1997, DSE-vol. 62/HTD-vol. 354, MEMS, pp. 143-152.

B. X. Wang et al., *Experimental investigation on liquid forced-convection heat transfer through microchannels*, 1994, Int. J. Heat Mass Transfer, vol. 37 Suppl. 1, pp. 73-82.

Kambiz Vafai et al., *Analysis of two-layered micro-channel heat sink concept in electronic cooling*, Int. J. Heat Mass Transfer, 42 (1999), pp. 2287-2297.

Gokturk Tune et al., *Heat transfer in rectangular microchannels*, 2002, Int. J. Heat Mass Transfer, 45 (2002), pp. 765-773.

D. B. Tuckerman et al., *High-Performance Heat Sinking for VLSI*, 1981, IEEE Electron Device Letters, vol. EDL-2, No. 5, pp. 126-129.

Bengt Sunden et al., *An Overview of Fabrication Methods and Fluid Flow and Heat Transfer Characteristics of Micro Channels*, pp. 3-23.

David S. Shen et al., *Micro Heat Spreader Enhance Heat Transfer in MCMs*, 1995, IEEE Multi-Chip Module Conference, pp. 189-194.

S. Sasaki et al., *Optimal Structure for Microgrooved Cooling Fin for High-Power LSI Devices*, Electronic Letters, Dec. 4, 1986, vol. 22, No. 25.

Vijay K. Samalam, *Convective Heat Transfer in Microchannels*, Sep. 1989, Journal of Electronic Materials, vol. 18, No. 5, pp. 611-617.

Sanjay K. Roy et al., *A Very High Heat Flux Microchannel Heat Exchanger for Cooling of Semiconductor Laser Diode Arrays*, 1996, IEEE Transactions on components, packaging, and manufacturing technology-part B, vol. 19, No. 2, pp. 444-451.

Charlotte Gillot et al., *Integrated Single and Two-Phase Micro Heat Sinks Under IGBT Chips*, IEEE Transactions on Components and Packaging Technology, vol. 22 No. 3, Sep. 1999, pp. 384-389.

X.F. Peng et al., "Enhancing the Critical Heat Flux Using Microchanneled Surfaces", Enhanced Heat Transfer, 1998, vol. 5 pp. 165-176.

H. Krumm "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

\* cited by examiner

OPTIMAL SPREADER SYSTEM, DEVICE AND METHOD FOR FLUID COOLED MICRO-SCALED HEAT EXCHANGE

RELATED APPLICATION

This Patent Application claims priority under 35 U.S.C. 119 (e) of the co-pending U.S. Provisional Patent Application, Ser. No. 60/423,009, filed Nov. 1, 2002 and entitled "METHODS FOR FLEXIBLE FLUID DELIVERY AND HOTSPOT COOLING BY MICROCHANNEL HEAT SINKS" which is hereby incorporated by reference. This Patent Application also claims priority under 35 U.S.C. 119 (e) of the co-pending U.S. Provisional Patent Application, Ser. No. 60/442,383, filed Jan. 24, 2003 and entitled "OPTIMIZED PLATE FIN HEAT EXCHANGER FOR CPU COOLING" which is also hereby incorporated by reference. In addition, this Patent Application claims priority under 35 U.S.C. 119 (e) of the co-pending U.S. Provisional Patent Application, Ser. No. 60/455,729, filed Mar. 17, 2003 and entitled MICROCHANNEL HEAT EXCHANGER APPARATUS WITH POROUS CONFIGURATION AND METHOD OF MANUFACTURING THEREOF", which is hereby incorporated by reference.

FIELD OF THE INVENTION

This invention relates to the field of heat exchangers. More particularly, this invention relates to systems, devices for, and methods of utilizing spreaders for fluid cooled micro-scaled heat exchange in a optimal manner.

BACKGROUND OF THE INVENTION

Due to the increasing performance of electronic components, there is a need for higher rates of heat removal. These components have increased heat generation and smaller package sizes. For example, there is a need to dissipate heat from personal computer Central Processing Units (CPUs) in the range of 50 to 200 W.

Forced and natural convection air cooling methods in conjunction with heat sinks currently serve as the predominant method of cooling electronics. The current conventional air cooling systems that use aluminum extruded or die-casting fin heat sinks are not sufficient for cooling the high heat flux of chip surfaces or for large heat dissipation with low thermal resistance and compact size. However, these air-cooled heat sinks require more surface area to effectively function. To be able to transfer the increased heat load, the heat sinks have become larger. To accommodate larger heat sinks, processors use a thermally conductive heat spreader. Unfortunately, the heat spreader increases the overall size of surface area on a printed circuit board required by such an electronic component. This has required the use of larger fans to overcome increased pressure drops. Thus, current cooling methods require substantial space on the one hand, while blocking airflow entry and escape paths on the other.

Furthermore, high aspect ratio fins are used to dissipate heat to the ambient with low thermal resistance. But, there is a need to maintain temperature uniformity in the X-Y direction—a shortcoming of current traditional heat dissipation methods which only transfer heat in one direction.

Therefore, there is a need for a more efficient and effective cooling system. This goal can be reached by the use of liquid cooling methods and devices. A liquid pumped cooling system can remove more heat with considerably less flow volume and maintain better temperature uniformity. These results are reached with significantly less acoustic noise.

SUMMARY OF THE INVENTION

The miniaturization of electronic components has created significant problems associated with the overheating of integrated circuits. Effective cooling of heat flux levels exceeding 100 W/cm$^2$ from a relatively low surface area is required. Fluid cooled micro-scaled heat exchangers offer substantial benefits in heat flux removal capability compared with conventional cooling devices. It should be understood that depending on the embodiment of the current invention, the micro-scaled heat exchanger comprises microchannels, a micro-porous structure, or micro-pillars, or is comprised from the group of microchannels, a micro-porous structure, and micro-pillars.

Heat fluxes exceeding 100 W/cm$^2$ can be removed using the currently disclosed micro-scaled heat exchanger comprising microchannels in silicon or other materials, from heat sources such as a microprocessor, for example. Unlike prior art, the fluid cooled micro-scaled heat exchangers disclosed in the current invention provide extremely high heat transfer area per unit volume in an optimal manner. The micro-scaled heat exchangers of the preferred embodiment of the current invention consist of microchannels with a microchannel walls with width dimensions in the range of and including 10 microns to 100 microns. Alternate embodiments of the micro-scaled heat exchanger include microchannels, a micro-porous structure, or micro-pillars, or are comprised from the group of microchannels, a micro-porous structure, and micro-pillars. The preferred embodiment of the current invention maintains substantial temperature uniformity in the X-Y direction in addition to dissipating heat to the ambient with low thermal resistance. This is accomplished by utilizing high aspect ratio fins that transfer heat to the ambient with low thermal resistance while still maintaining temperature uniformity in the X-Y direction—a shortcoming of current traditional heat dissipation methods which only transfer heat in one direction.

For fluid cooled micro-scaled heat exchangers to provide extremely high heat transfer area per unit volume, the geometric parameters of the exchangers must be considered carefully because these parameters have an influence on the convective heat transfer characteristics. Therefore, designs of systems using the present invention preferably optimize key parameters such as the pressure required to pump the cooling fluid, the flow rate, the hydraulic diameter of the channel, the temperature of the fluid and the channel wall, and the number of channels. The current invention provides optimized parameters, allowing the fluid cooled micro-scaled heat exchanger to serve as an efficient and economical means for removing high heat per unit volume.

The embodiments of the current invention provide specific types of spreaders used for fluid cooled micro-scaled heat exchange. Specific materials and ranges of dimensions that have been shown through simulations to yield major performance benefits are also disclosed within the current invention. Microchannels with high aspect ratios with depth/width ratios in the range of 10-50 are preferred for the micro-scaled heat exchanger, particularly for single-phase liquid flow. These aspect ratios allow large amounts of fluid to be pumped through the fluid cooled micro-scaled heat exchanger with optimized pressure drop, while simultaneously allowing the fluid to maintain a high thermal convection coefficient to the microchannel sidewalls in the microchanneled embodiment of the current invention.

In the preferred embodiment of the current invention, a spreader region and a micro-scaled region comprise the separate components of the micro-scaled fluid cooled heat exchange device. The spreader region (preferably comprising copper) is preferably interposed between the micro-scaled region (preferably comprising silicon) and the heat source (preferably a microprocessor). In alternate embodiments of the current invention, the spreader region, the micro-scaled region, and the heat source are in a monolithic configuration (i.e. the components of the device consist of, constitute, or are formed from a single unit) and form a monolithic structure. Regardless of the embodiment, the higher thermal conductivity spreader region is wider laterally than the heat source and lies between the micro-scaled region and the heat source and that the micro-scaled overhangs with respect to the heat source (on either side of the heat source) as described more fully below.

The specific width for the micro-scaled and spreader regions are disclosed. In addition, the current invention discloses specific ranges of optimal dimensions of the micro-scaled and spreader regions that maximize thermal performance.

DETAILED DESCRIPTION OF THE PREFERRED EMBODIMENTS

The geometric parameters of heat exchangers have a significant influence on their convective heat transfer characteristics. Therefore, designs according to the present invention preferably optimize key parameters of heat exchange such as: the pressure required to pump the cooling fluid; the flow rate; the hydraulic diameter of the channel; the temperature of the fluid and the channel wall; and the number of channels required. The current invention provides optimized parameters, allowing the fluid cooled micro-scaled optimized spreader to serve as an efficient and economical means for dissipating high heat per unit volume.

Embodiments of the current invention provide effective and efficient solutions for optimizing the absolute and relative dimensions of a fluid cooled micro-scaled heat exchanger, its spreader and micro-scaled regions, as well as the overhang of the micro-structure region with respect to a heat source (e.g. a microprocessor). The thickness and width of the micro-scaled region and the spreader region of the current invention balance the vertical thermal resistance of the micro-scaled region and the spreader region against the increase in area for optimized heat transfer into a fluid.

Figure 1A:
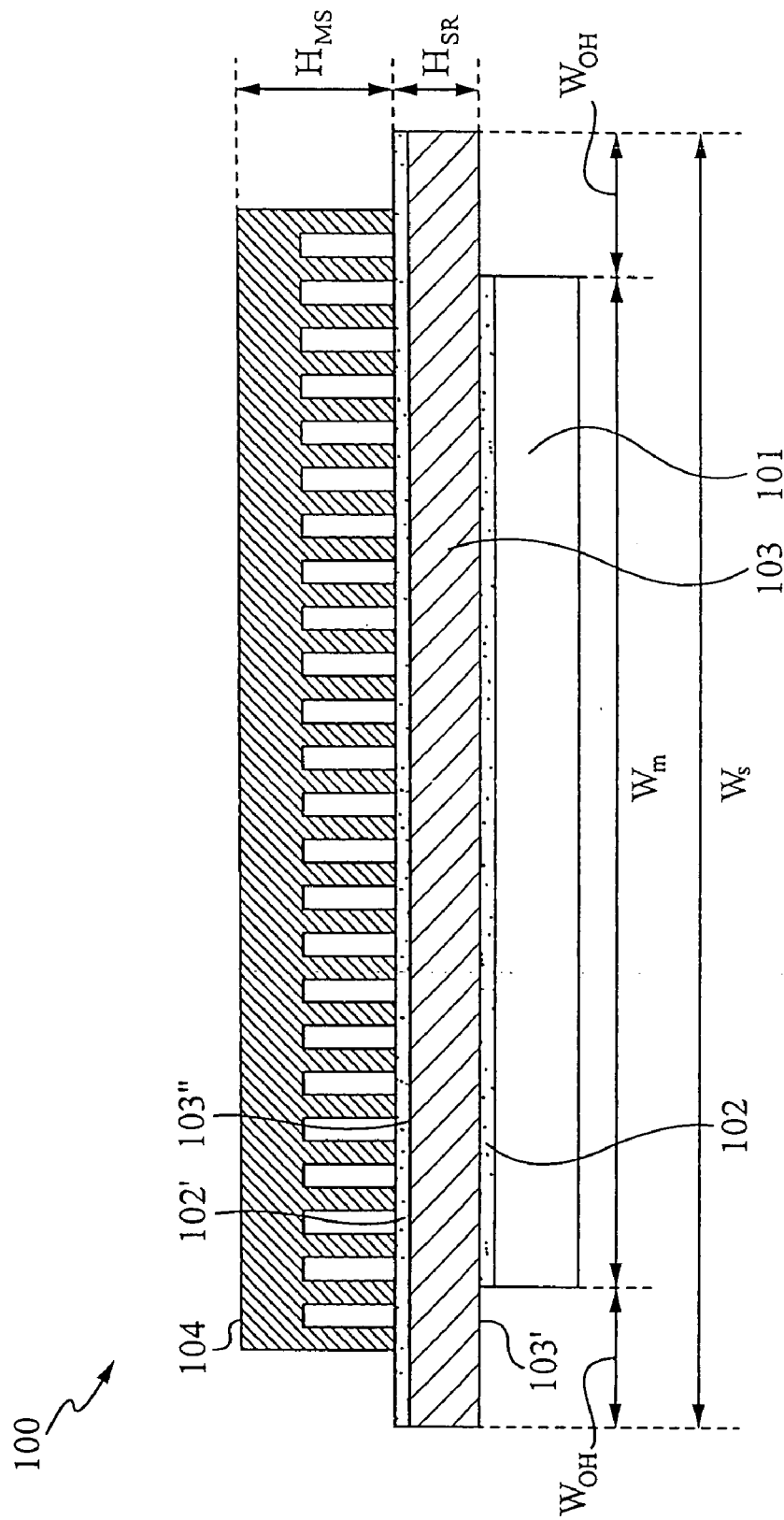
FIG. 1A illustrates a cross-sectional view of a fluid cooled micro-scaled heat exchanger in which fluid directly contacts the spreader region, in accordance with the instant invention.

FIG. 1A shows a device 100 for fluid cooled micro-scaled heat exchange from a heat source 101. In the preferred embodiment of the current invention, the heat source 101 is a microprocessor. The fluid preferably comprises water, but in alternate embodiments of the current invention, the fluid is comprised from the group of water, ethylene glycol, isopropyl alcohol, ethanol, methanol, and hydrogen peroxide. Preferably, the device 100 comprises a composite fluid cooled micro-scaled heat exchange region 104 and a spreader region 103, wherein the fluid preferably directly contacts the spreader region 103, as described in greater detail below.

Specifically, the device 100 shown comprises a spreader region 103 and a micro-scaled region 104. The heat source 101 preferably has a width. The micro-scaled region 104 is configured to permit flow of fluid therethrough and has a width and a thickness. Further, the spreader region 103 has a width and a thickness. In the preferred embodiment of the current invention, the width of the spreader region 103 and the micro-scaled region 104 are greater than the width of the heat source 101.

As disclosed in embodiments of the current invention, the optimal thickness of the spreader region, the dimension $H_{SR}$, are in the range of 0.3 to 2.0 millimeters. Further, the overhang dimension $W_{OH}$, otherwise referred to as the difference between either of the widths of the micro-scaled region and the respective heat source, $W_s - W_m$, is in the range of 0 to 15 millimeters on each side of the heat source. The height of the micro-scaled region 104, $H_{MS}$, is discussed in detail below. The actual value chosen depends on many considerations such as manufacturing cost, for example.

The micro-scaled region 104 is configured to permit flow of fluid therethrough. The micro-scaled region 104 preferably comprises microchannels, wherein the microchannels comprise walls, but in alternate embodiments comprises a micro-porous structure, or micro-pillars, or is comprised from the group of microchannels, a micro-porous structure, and micro-pillars. The spreader region 103 of the present invention is alternatively utilized in conjunction with a heat exchanger described in co-pending patent application Ser. No. 10/680,584, filed on Oct. 6, 2003, and entitled "METHOD AND APPARATUS FOR EFFICIENT VERTICAL FLUID DELIVERY FOR COOLING A HEAT PRODUCING DEVICE", which is hereby incorporated by reference. In addition, more details of the microchannels, micro-pillars, and micro-porous structures can be found in co-pending patent application Ser. No. 10/698,304 filed on Oct. 30, 2003, and entitled "METHOD AND APPARATUS FOR ACHIEVING TEMPERATURE UNIFORMITY AND HOT SPOT COOLING IN A HEAT PRODUCING DEVICE", which is hereby incorporated by reference.

Figure 1B:
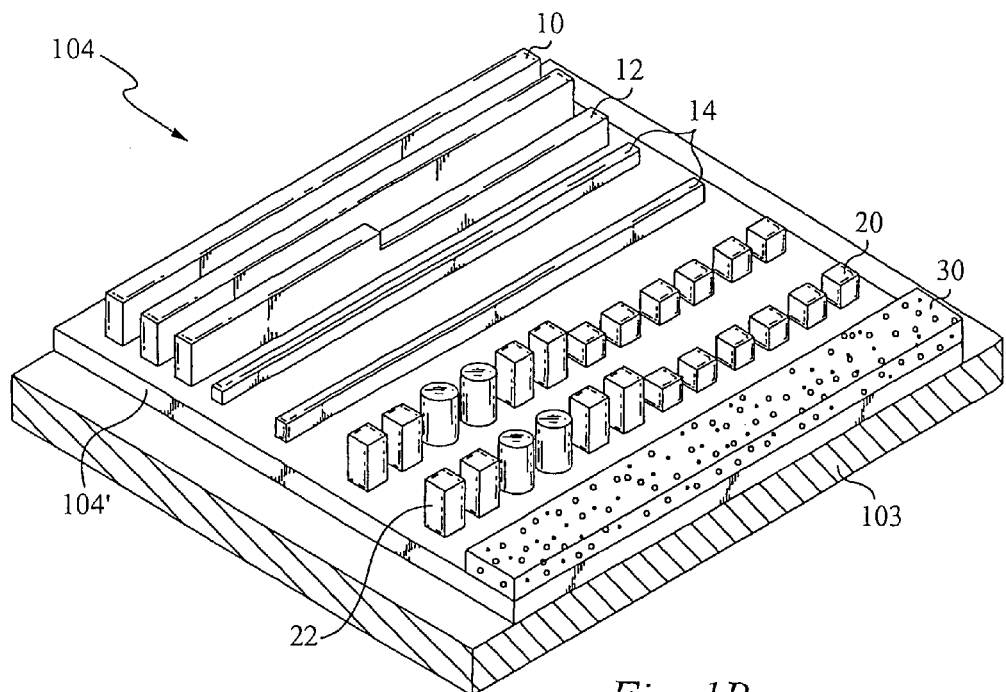
FIG. 1B illustrates a perspective view of the of a micro-scaled region having several different heat transferring features in accordance with the present invention.

FIG. 1B illustrates a perspective view of the micro-scaled region 104 coupled to the spreader region 103. The micro-scaled region 104 shown in FIG. 1B has several different heat transferring features in accordance with the present invention. The micro-scaled region 104' includes multiple microchannels 10, wherein two of the microchannels are of the same shape and one microchannel 12 has a portion extending taller than the other portion. Further, the microchannels 14 are located a further distance away from one another compared to the distance between microchannels 10 and 12. In addition, the micro-scaled region 104' includes several micro-pillars 20 and 22 of various height dimensions disposed thereon in accordance with the present invention. As shown in FIG. 1B, the micro-pillars 22 extend vertically from the bottom surface of the micro-scaled region 104' to a predetermined height, potentially the entire height of the micro-scaled region 104'.

The micro-pillars 20 extend vertically an amount less than the micro-pillars 22. The micro-pillars 22 can have any shape including, but not limited to, pins (FIG. 1B), square (not shown), diamond (not shown), elliptical (not shown), hexagonal (not shown), circular or any other shape. The micro-scaled region 104' alternatively has a combination of differently shaped micro-pillars disposed thereupon. In addition, FIG. 1B illustrates a micro-porous structure 30 disposed on the micro-scaled region 104'.

It is apparent that the micro-scaled region 104' can include one type of heat transferring feature or alternatively any combination of different heat transferring features (e.g. microchannels, micro-pillars, micro-porous structures).

The preferred embodiment of the current invention comprises microchannels, wherein the microchannels comprise walls, with heights (i.e., direction normal to the heat source) $H_{MS}$ in the range of 50 microns-2 millimeters and widths of the microchannel walls in the range of 10-150 micrometers. The current manufacturing techniques that can achieve these aspect ratios include plasma etching and LIGA manufacturing. Most of these techniques are currently dedicated to semiconductor manufacturing (primarily silicon). In the preferred embodiment of the current invention, the micro-scaled region 104 comprises silicon. Silicon offers a reasonably high thermal conductivity (~120 W/m-K), which allows the heat to conduct effectively up the sidewalls of the microchannels. In alternate embodiments of the current invention, the micro-scaled region 104 comprises a material with thermal conductivity larger than 25 W/m-K. In yet other embodiments, the micro-scaled region 104 comprises a semiconducting material. Alternate materials for the micro-scaled region 104 providing adequate aspect ratios include, but are not limited to, silicon, germanium, silicon carbide, precision machined metals and alloys, or composites/combinations. Further, the spreader region 103 preferably comprises copper. Copper (~400 W/m-K) is the preferred material for the spreader region 103 because of cost and thermal conductivity considerations, although diamond (~2000 W/m-K), silver (~430 W/m-K), aluminum (~395 W/m-K), silicon carbide (~400 W/m-K), or a combination/composite may also be utilized. It is important to note that any material with a thermal conductivity equal to or greater than silicon allowing for heat spreading by the spreader region 103 can be used for the spreader region 103. In alternate embodiments of the current invention, the spreader region 103 comprises a material with a thermal conductivity value larger than 200 W/m-K.

The spreader region 103 comprises a first side 103' and a second side 103". The first side 103' is positioned on and coupled to the heat source 101 and the second side 103" is coupled to the micro-scaled region 104. Preferably, the first side 103' is coupled to the heat source 101 via a thermal attachment means 102 and the second side 103" is coupled to the micro-scaled region 104 via a second thermal attachment means 102'.

In alternate embodiments of the current invention, the spreader region 103, the micro-scaled region 104, and the heat source 101 are in a monolithic configuration and form a monolithic structure.

In order to achieve a minimal thermal resistance between the fluid in the micro-scaled region 104 and the heat released by the heat source 101 (e.g., a microprocessor), it is preferred for the heat to spread slightly, laterally, as it moves from the heat source 101 to the micro-scaled region 104. Thus, the spreader region 103, as well as the first and second thermal attachment means 102 and 102' preferably comprise a high thermal conductivity material. In addition, the use of slightly larger lateral dimensions for the spreader region 103, such that the total area for heat absorption by the fluid is augmented, is also preferred. Thus, the optimal thickness and width of the spreader region 103 and the micro-scaled region 104 balance the vertical thermal resistance of the spreader 103 against the increase in area for heat transfer into the fluid, as disclosed below. The dimensions are also determined by whether there is single phase (e.g., only liquid) or two phase (e.g., liquid and boiling liquid) cooling occurs and by the configuration of the micro-scaled region 104. The three tables below provide preferred dimensions depending on the configuration of the micro-scaled region 104 as well as on the phase of cooling occurring.

TABLE 1

| Micro-scaled region (comprising a micro-porous structure) and Spreader region properties | Single Phase | Two Phase |
| --- | --- | --- |
| Thickness of spreader region | 0.3-0.7 mm | 0.3-1.0 mm |
| Average Size of Pore | 10-200 micron | 10-200 micron |
| Porosity of micro-porous structure | 50-80% | 50-80% |
| Height of micro-scaled region | 0.25-2.0 mm | 0.25-2.0 mm |
| Overhang of micro-scaled region with respect to heat source width | 0-5.0 mm | 0-15.0 mm |

TABLE 2

| Micro-scaled region (comprising micro-pillars) and Spreader region properties | Single Phase | Two Phase |
| --- | --- | --- |
| Thickness of spreader region | 0.3-0.7 mm | 0.3-1.0 mm |
| Cross sectional area of micro-pillar | (10 micron)$^2$-(100 micron)$^2$ | (10 micron)$^2$-(100 micron)$^2$ |
| Separation between micro-pillars | 10-150 micron | 10-150 micron |
| Height of micro-pillar | 50-800 micron | 50-2.0 mm |
| Overhang of micro-scaled region with respect to heat source width | 0-5.0 mm | 0-15.0 mm |

TABLE 3

| Micro-scaled region (comprising microchannels) and Spreader region properties | Single Phase | Two Phase |
| --- | --- | --- |
| Thickness of spreader region | 0.3-0.7 mm | 0.3-1.0 mm |
| Width of micro-channel wall | 10-100 micron | 10-100 micron |
| Separation between micro-channel walls | 10-150 micron | 10-150 micron |
| Height of micro-channel wall | 50-800 micron | 50-2.0 mm |
| Overhang of micro-scaled region with respect to heat source width | 0-5.0 mm | 0-15.0 mm |

It should be understood that the optimal dimensions listed in the Tables 1, 2, and 3 are a function of the material and fluid properties. However, it will be appreciated that the optimal dimensions listed will be adjusted by the practitioner if materials or fluids other than those discussed in the current invention are utilized.

The spreader region 103 and the micro-scaled region 104 can be attached (as shown by the first and second thermal attachment means 102 and 102') using any of a variety of methods including, but not limited to, anodic bonding, brazing, soldering, and bonding by epoxy.

As stated above, the micro-scaled region preferably comprises microchannels, wherein the microchannels comprise walls. At least one of the microchannels has a height dimension within the range of and including 50 microns and 2 millimeters and at least two of the microchannels are separate from each other by a spacing dimension within the range of and including 10 to 150 microns. The preferred microchannels comprises at least one of the microchannels has a width dimension within the range of and including 10 to 150 microns.

In alternate embodiments, the micro-scaled region comprises a micro-porous structure. The micro-porous structure comprises a porous material with a porosity within the range of and including 50 to 80 percent, with the micro-porous structure having an average pore size within the range of and including 10 to 200 microns. The micro-porous structure alternate embodiment comprises a height within the range of and including 0.25 to 2.0 millimeters.

In yet another embodiment, the micro-scaled region comprises micro-pillars. The micro-pillars comprise a plurality of pins, wherein at least one of the plurality of pins has an area dimension within the range of and including (10 micron)$^2$ and (100 micron)$^2$. At least one of the plurality of pins has a height dimension within the range of and including 50 microns and 2 millimeters, and at least two of the plurality of pins are separated from each other by a spacing dimension within the range of and including 10 to 150 microns. It should also be understood that in another alternative, the micro-scaled region is comprised from the group of microchannels, a micro-porous structure, and micro-pillars.

Figure 2:
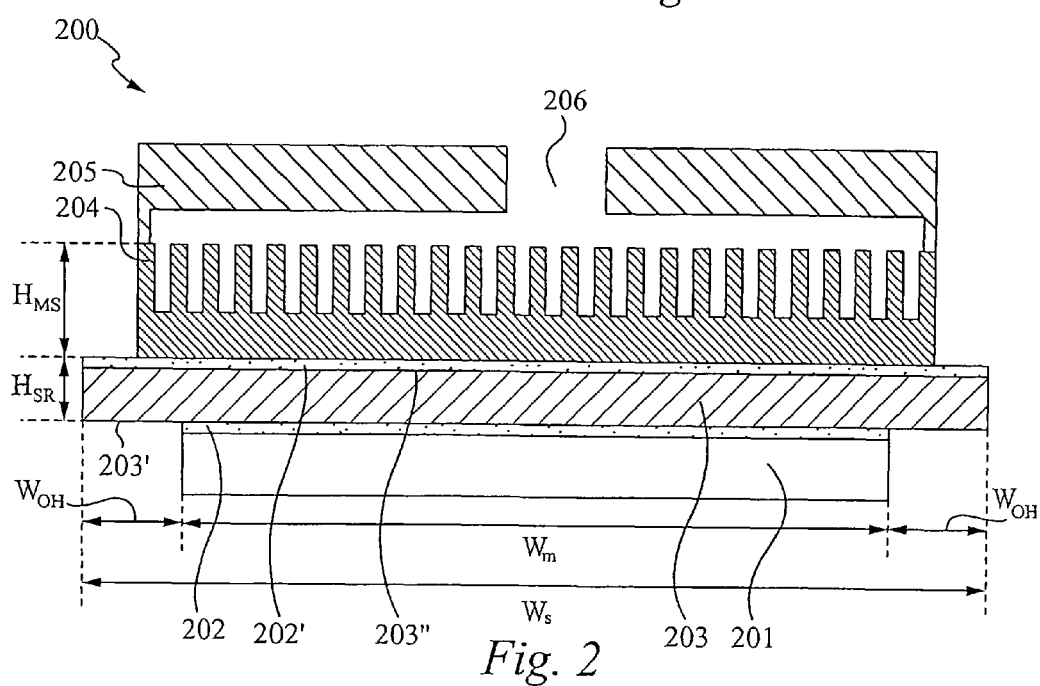
FIG. 2 illustrates a cross-sectional view schematic of a composite fluid cooled micro-scaled heat exchanger with a manifolding layer, in accordance with the instant invention.

FIG. 2 illustrates a cross-sectional view schematic of a composite fluid cooled micro-scaled heat exchanger with a manifolding layer, in accordance with the instant invention. Specifically, FIG. 2 shows an alternate embodiment of the current invention, wherein the device 200 comprises a heat source 201, a thermal attachment means 202, a spreader region 203 with a first side 203' and a second side 203", a second thermal attachment means 202', a micro-scaled region 204, and a manifolding layer 205. The fluid enters and exits the device 200 via the inlet/outlet 206. The micro-scaled region 204 is configured to receive fluid from the inlet/outlet 206 and permit flow of fluid through the micro-scaled region 204. The micro-scaled region 204 preferably comprises microchannels, wherein the microchannels comprise walls, but alternatively, may comprise a micro-porous structure, or micro-pillars, or is comprised from the group of microchannels, a micro-porous structure, and micro-pillars. The preferred micro-scaled region 204 microchannels comprise depths (direction normal to the heat source) in the range of 50 microns to 2 millimeters and widths in the range of 10-150 micrometers. The micro-scaled region 204 walls preferably comprise a silicon material. Alternative materials available for use for the microchannel walls include silicon carbide, diamond, any material with thermal conductivity larger than 25 W/m-K, a semiconducting material, or other materials discussed above.

The spreader region 203 comprises a first side 203' and a second side 203". The first side 203' is positioned on and coupled to the heat source 201 and the second side 203" is coupled to the micro-scaled region 204. Preferably, the first side 203' is coupled to the heat source 201 via a thermal attachment means 202 and the second side 203" is coupled to the micro-scaled region 204 via a second thermal attachment means 202'. The first and second thermal attachment means 202 and 202' preferably comprise high thermal conductivity material. The spreader region 203 and the micro-scaled region 204 (or the spreader region 203, the micro-scaled region 204, and manifolding layer 205), can be attached (as shown, for example, by the first and second thermal attachment means 202 and 202') using any of a variety of methods including, but not limited to, anodic bonding, brazing, soldering, and bonding by epoxy. In alternate embodiments of the current invention, the spreader region 203, the micro-scaled region 204, the manifolding layer 205, and the heat source 201 are in a monolithic configuration and form a monolithic structure.

The spreader region 203 comprises copper, although diamond, silver, aluminum, and silicon carbide, a composite, or the other materials described above may also be utilized. Further, any material, or composite with a higher thermal conductivity than silicon (i.e., thermal conductivity values larger than 200 W/m-K) can be used for the spreader region 203.

The manifolding layer 205 comprises interwoven manifolds preferably coupled to the micro-scaled region 204. In other embodiments, these interwoven manifolds are coupled to the spreader region 203 alone, or, alternatively, to both the micro-scaled region 204 and the spreader region 203. The manifolding layer 205 preferably comprises glass. The manifolding layer 205 illustrated in the FIG. 2 could also be utilized in other embodiments of the current invention. In alternate embodiments, the manifolding layer comprises a plurality of individualized holes for channeling fluid into and out of the heat exchange device. The details of manifolding layers and various embodiments of the manifolding layers are discussed in co-pending patent application Ser. No. 10/680, 584, filed on Oct. 6, 2003, and entitled "METHOD AND APPARATUS FOR EFFICIENT VERTICAL FLUID DELIVERY FOR COOLING A HEAT PRODUCING DEVICE", which is hereby incorporated by reference.

The current invention also discloses a method for fabricating a fluid cooled micro-scaled heat exchange device comprising fabricating a micro-scaled region comprising silicon, fabricating a spreader region comprising copper, and coupling the micro-scaled region with the spreader region. In alternate methods, the micro-scaled region and the spreader region are monolithic, as described above. The preferred method entails fabricating the micro-scaled spreader region from precision machined metals. In alternate methods, the micro-scaled spreader region is fabricated from precision machined alloys.

Further, a system for fluid cooled micro-scaled heat exchange is disclosed. The system (not shown) comprises a heat source, means for spreading heat, means for supplying fluids, and means for micro-scaled fluid flow. The means for spreading heat is coupled to the heat source. The means for micro-scaled fluid flow is configured to receive fluid from the means for supplying fluid. The means for micro-scaled fluid flow preferably comprises microchannels, wherein the microchannels comprise walls, but in alternate embodiments, comprises a micro-porous structure, or micro-pillars, or is comprised from the group of microchannels, a micro-porous structure, and micro-pillars. microchannels. The means for micro-scaled fluid flow is coupled to the means for spreading heat.

Figure 3A:
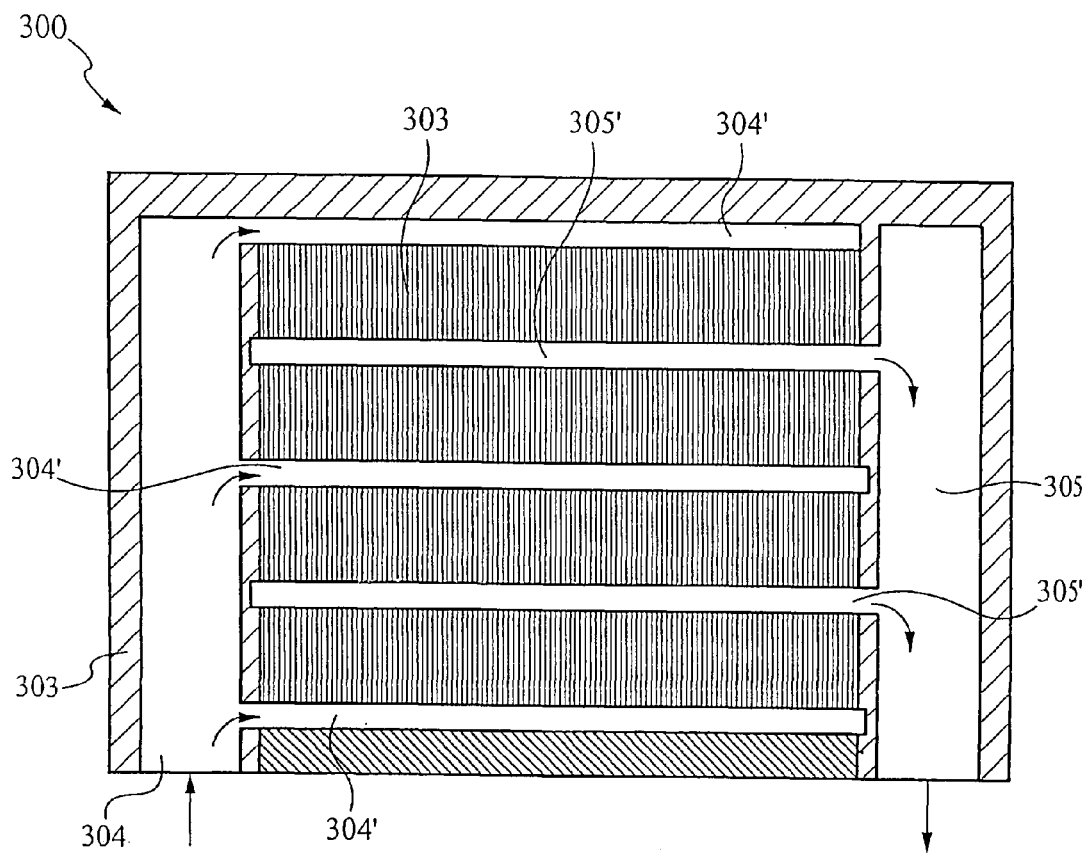
FIG. 3A illustrates a schematic drawing of a composite fluid cooled micro-scaled heat exchanger which includes interwoven manifolds on the top layer, in accordance with the instant invention.

FIG. 3A illustrates a more detailed drawing of the embodiment comprising a composite fluid cooled micro-scaled heat exchange device with interwoven manifolds on the top layer, in a geometry similar to FIG. 2. Specifically, FIG. 3A shows a device 300. The device 300 comprises a spreader region 302, and first manifolding layer 304, a plurality of first manifolding layer fluid paths 304, and second manifolding layer 305, and plurality of second manifolding layer fluid paths 305, and a micro-scaled region 303. In one embodiment, the device 300 size is approximately 18 mm×12 mm×3 mm. The microchannel region 303 height is 300 micron, the width is 50 micron, and the base is 200 micron. The spreader region 302 is 300 micron thick and preferably copper. The heat source (not shown) is approximately 0.725 millimeter wide. The first and second manifolds are approximately 2 millimeter wide and 10 millimeter long, with fluid paths 304 and 305 comprise inlets and outlets configured to receive fluid, at a minimum, from the first and second manifolding layers. It will be appreciated that the dimensions recited are exemplary and other dimensions can be used for heat sources with other sizes.

Figure 3B:
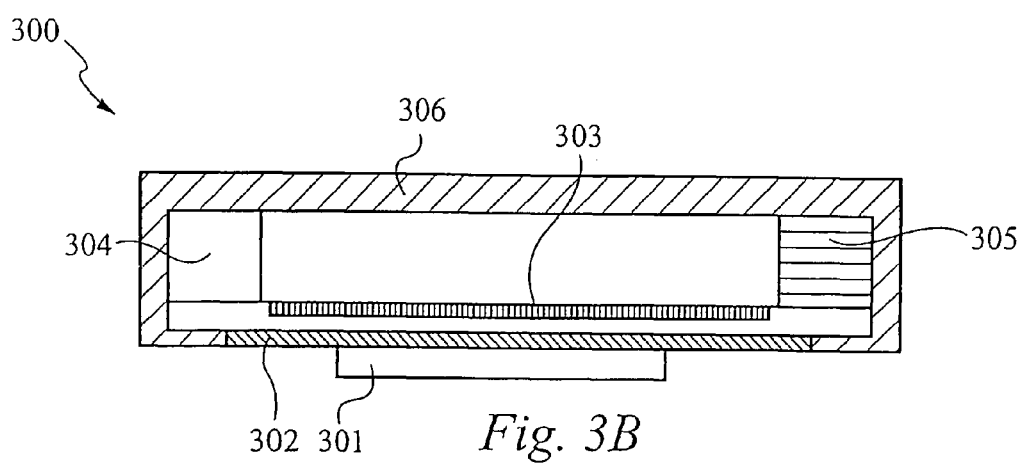
FIG. 3B illustrates a cross-sectional view of the composite fluid cooled micro-scaled heat exchanger shown in FIG. 3A, in accordance with the instant invention.

FIG. 3B shows a monolithic heat exchange device 300. The device 300 comprises a heat source 301, a spreader region 302, a micro-scaled region 303, a first manifolding layer 304, a second manifolding layer 305, and a top manifold 306. In one embodiment, the height from the micro-scaled region 3030 to the top of the top manifold 306 is approximately 3 millimeters while the height from the micro-scaled region 303 to the tip of the first and second manifold layers 304 and 305 is approximately 2 millimeters. It will be appreciated that the dimensions recited are exemplary and other dimensions can be used for heat sources with other sizes.

Unlike prior art, the fluid cooled micro-scaled heat exchangers disclosed in the current invention provide extremely high heat transfer area per unit volume in an optimal manner. Further, the current invention maintains substantial temperature uniformity in the X-Y direction in addition to dissipating heat to the ambient with low thermal resistance. Another advantage of the current invention is that it uses a spreader region to enhance lateral spreading of heat leaving the heat source, together with the micro-scaled region to achieve high aspect ratio structures that aid with transferring heat to the fluid creating a optimal composite material fluid cooled micro-scaled heat exchanger.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A device for fluid cooled micro-scaled heat exchange, the device comprising:
    a plurality of substantially parallel micro-scaled regions having a fluid inlet side and a fluid outlet side configured to permit flow of fluid therethrough;
    a plurality of inlet channels, interleaved between the micro-scaled regions and coupled to the fluid inlet side of each micro-scaled region, wherein a direction of fluid flow at the inlet side in adjacent micro-scaled regions is in substantially opposite directions;
    a plurality of outlet channels, interleaved between the micro-scaled regions and coupled to the fluid outlet side of each micro-scaled region, wherein the direction of fluid flow at the outlet side in adjacent micro-scaled regions is in substantially opposite directions; and
    a spreader region, wherein the spreader region comprises a first side and a second side, wherein the first side is positioned on and coupled to a heat source, and wherein the second side is coupled to the plurality of micro-scaled regions.

2. The device in claim 1, wherein the spreader region comprises a thickness dimension within the range of and including 0.3 millimeter to 1.0 millimeters.

3. The device in claim 1, wherein the spreader region and the micro-scaled regions are both wider than the heat source defining an overhang of the heat source, and wherein the plurality of micro-scaled regions overlay the heat source.

4. The device in claim 3, wherein the overhang of the micro-scaled regions is in the range of and including 0.0 millimeters to 15.0 millimeters.

5. The device in claim 1, wherein the micro-scaled regions comprise microchannels, wherein the microchannels comprise walls.

6. The device in claim 5, wherein at least one of the microchannel walls has a width dimension within a range of and, including 10 microns to 100 microns.

7. The device in claim 5, wherein at least one of the microchannel walls has a height dimension within a range of and including 50 microns and 2.0 millimeters.

8. The device in claim 5, wherein at least two of the microchannel walls are separated from each other by a spacing dimension within a range of and including 10 microns to 150 microns.

9. The device in claim 1, wherein the micro-scaled regions comprise a micro-porous structure.

10. The device in claim 9, wherein the micro-porous structure comprises a porous material with a porosity within a range of and including 50 to 80 percent.

11. The device in claim 9, wherein the micro-porous structure has an average pore size within a range of and including 10 microns to 200 microns.

12. The device in claim 9, wherein the micro-porous structure comprises a height within a range of and including 0.25 millimeter to 2.0 millimeters.

13. The device in claim 1, wherein the micro-scaled regions comprise micro-pillars.

14. The device in claim 13, wherein the micro-pillars comprise a plurality of pins, wherein at least one of the plurality of pins has a Cross sectional area within a range of and including 10 $(micron)^2$ and 100 $(micron)^2$.

15. The device in claim 14, wherein at least one of the plurality of pins has a height dimension within a range of and including 50 microns and2.0 millimeters.

16. The device in claim 14, wherein at least two of the plurality of pins are separated from each other by a spacing dimension within a range of and including 10 microns to 150 microns.

17. The device in claim 1, wherein the micro-scaled regions comprise any one of microchannels, a micro-porous structure, and micro-pillars.

18. The device in claim 1, wherein the micro-scaled regions comprise silicon.

19. The device in claim 1, wherein the micro-scaled regions comprise a material with thermal conductivity larger than 25 W/m-K.

20. The device in claim 1, wherein the micro-scaled regions comprise a high aspect ratio micro-machined material.

21. The device in claim 1, wherein the micro-scaled regions comprise semiconducting material.

22. The device in claim 1, wherein the micro-scaled regions comprise precision machined metals.

23. The device in claim 1, wherein the micro-scaled regions comprise precision machined alloys.

24. The device in claim 1, wherein the spreader region comprises a material with a thermal conductivity value larger than 120 W/m-K.

25. The device in claim 1, wherein the spreader region is interposed between the micro-scaled regions and the heat source.

26. The device in claim 1, wherein the spreader region comprises copper.

27. The device in Claim 1, wherein the spreader region comprises diamond.

28. The device in claim 1, wherein the spreader region comprises silicon carbide.

29. The device in claim 1, wherein the heat source is a microprocessor.

30. The device in claim 1, further comprising a plurality of manifolding layers coupled to the spreader region.

31. The device in claim 30, wherein the plurality of manifolding layers comprise interwoven manifolds.

32. The device in claim 31, wherein the plurality of manifolding layers further comprise a plurality of individualized holes for channeling fluid into and out of the device.

33. The device in claim 1, further comprising a plurality of manifolding layers coupled to the micro-scaled regions.

34. The device in claim 33, wherein the plurality of manifolding layers comprise interwoven manifolds.

35. The device in claim 33, wherein the plurality of manifolding layers further comprise a plurality of individualized holes for channeling fluid into and out of the device.

36. The device in claim 1, further comprising a plurality of fluid paths coupled to the micro-scaled regions, wherein the plurality of fluid paths are configured to receive fluid and permit the flow of fluid therethrough.

37. The device in claim 1, wherein the heat source, the spreader region, and the micro-scaled regions are in a monolithic configuration.

38. The device in claim 1, wherein the micro-scaled regions and the spreader region are coupled by an anodic bonding method.

39. The device in claim 1, wherein the micro-scaled regions and the spreader region are coupled by a fusion bonding method.

40. The device in claim 1, wherein the micro-scaled regions and the spreader region are coupled by a eutectic bonding method.

41. The device in claim 1, wherein the micro-scaled regions and the spreader region are coupled by an adhesive bonding method.

42. The device in claim 1, wherein the micro-scaled regions and the spreader region are coupled by a brazing method.

43. The device in claim 1, wherein the micro-scaled regions and the spreader region are coupled by a welding method.

44. The device in claim 1, wherein the micro-scaled regions and the spreader region are coupled by a soldering method.

45. The device in claim 1, wherein the micro-scaled regions and the spreader region are coupled by an epoxy method.

46. The device in claim 1, wherein the fluid comprises water.

47. The device in claim 1, wherein the fluid comprises any one of water, ethylene glycol, isopropyl alcohol, ethanol, methanol, and hydrogen peroxide.

48. A device for fluid cooled micro-scaled heat exchange comprising:
   a plurality of substantially parallel micro-scaled regions having a fluid inlet side and a fluid outlet side configured to permit flow of fluid therethrough, wherein each of the micro-scaled regions has a first width, and a thickness;
   a plurality of inlet channels, interleaved between the micro-scaled regions and coupled to the fluid inlet side of each micro-scaled region, wherein a direction of fluid flow at the inlet side in adjacent micro-scaled regions is in substantially opposite directions;
   a plurality of outlet channels, interleaved between the micro-scaled regions and coupled to the fluid outlet side of each micro-scaled region, wherein the direction of fluid flow at the outlet side in adjacent micro-scaled regions is in substantially opposite directions; and
   a spreader region with a second width and a thickness, wherein the spreader region comprises a first side coupled to a heat source having a heat source width and a second side coupled to the plurality of micro-scaled regions.

49. The device in claim 48, wherein the heat source, the spreader region, and the micro-scaled regions are in a monolithic configuration.

50. The device in claim 48, wherein the spreader region and the micro-scaled regions are both wider than the heat source defining an overhang of the heat source, and wherein the plurality of micro-scaled regions overlay the heat source.

51. The device in claim 50, wherein the overhang of the micro-scaled regions is in a range of and including 0.0 millimeters to 15.0 millimeters.

52. The device in claim 48, wherein the micro-scaled regions comprise microchannels, wherein the microchannels comprise walls.

53. The device in claim 52, wherein at least one of the microchannel walls has a width dimension within a range of and including 10 microns to 100 microns.

54. The device in claim 52, wherein at least one of the microchannel walls has a height dimension within a range of and including 50 microns and 2.0 millimeters.

55. The device in claim 52, wherein at least two of the microchannel walls are separated from each other by a spacing dimension within a range of and including 10 microns to 150 microns.

56. The device in claim 48, wherein the micro-scaled regions comprise a micro-porous structure.

57. The device in claim 56, wherein the micro-porous structure comprises a porous material with a porosity within a range of and including 50 to 80 percent.

58. The device in claim 56, wherein the micro-porous structure has an average pore size within a range of and including 10 microns to 200 microns.

59. The device in claim 56, wherein the micro-porous structure comprises a height within a range of and including 0.25 millimeter to 2.0 millimeters.

60. The device in claim 48, wherein the micro-scaled regions comprise micro-pillars.

61. The device in claim 60, wherein the micro-pillars comprise a plurality of pins, wherein at least one of the plurality of pins has a cross sectional area within a range of and including 10 $(micron)^2$ and 100 $(micron)^2$.

62. The device in claim 61, wherein at least one of the plurality of pins has a height dimension within a range of and including 50 microns and 2.0 millimeters.

63. The device in claim 61, wherein at least two of the plurality of pins are separated from each other by a spacing dimension within a range of and including 10 microns to 150 microns.

64. The device in claim 48, wherein the micro-scaled regions comprise any one of microchannels, a micro-porous structure, and micro-pillars.

65. The device in claim 48, wherein the heat source is a microprocessor.

66. The device in claim 48, wherein the micro-scaled regions width is greater than the heat source width.

67. The device in claim 48, wherein the first width is greater than the heat source width and the first width is substantially centered over the heat source width.

68. The device in claim 67, wherein the difference between the first width and the heat source width is in a range of 0.0 millimeter to 15 millimeters.

69. The device in claim 67, wherein the difference between the first width and the heat source width is in a range of 0.0 millimeter to 5.0 millimeters on each side of the heat source when the fluid is single phase.

70. The device in claim 67, wherein the difference between the first width and the heat source width is in a range of 5.0 millimeter -15 millimeters on each side of the heat source when the fluid is two phase.

71. The device in claim 48, wherein the first side further comprises a higher thermal conductivity region coupled to the heat source.

72. The device in claim 48, wherein the spreader region is interposed between the heat source and the micro-scaled regions.

73. The device in claim 48, wherein the spreader region comprises copper.

74. The device in claim 48, wherein the spreader region comprises diamond.

75. The device in claim 48, wherein the spreader region comprises silicon carbide.

76. A system for fluid cooled micro-scaled heat exchange comprising:
    means for spreading heat having a width and forming a spreader region, wherein the means for spreading heat is coupled to a heat source;
    means for supplying fluids; and
    means for micro-scaled fluid flow through a plurality of substantially parallel micro-scaled regions configured to receive fluid from the means for supplying fluid, wherein the means for micro-scaled fluid flow produces a fluid flow that is in substantially opposing directions for adjacent micro-scaled regions, and wherein the means for micro-scaled fluid flow is coupled to the means for spreading heat.

77. The device in claim 76, wherein the spreader region and the micro-scaled regions are both wider than the heat source defining an overhang of the heat source.

78. The device in claim 77, wherein the overhang of the micro-scaled regions is in a range of and including 0.0 millimeters to 15.0 millimeters.

79. The device in claim 76, wherein the micro-scaled regions comprise microchannels, wherein the microchannels comprise walls.

80. The device in claim 79, wherein at least one of the microchannel walls has a width dimension within a range of and including 10 microns to 100 microns.

81. The device in claim 79, wherein at least one of the microchannel walls has a height dimension within a range of and including 50 microns and 2.0 millimeters.

82. The device in claim 79, wherein at least two of the microchannel walls are separated from each other by a spacing dimension within a range of and including 10 microns to 150 microns.

83. The device in claim 76, wherein the micro-scaled regions comprise a micro-porous structure.

84. The device in claim 83, wherein the micro-porous structure comprises a porous material with a porosity within a range of and including 50 to 80 percent.

85. The device in claim 83, wherein the micro-porous structure has an average pore size within a range of and including 10 microns to 200 microns.

86. The device in claim 83, wherein the micro-porous structure comprises a height within a range of and including 0.25 millimeter to 2.0 millimeters.

87. The device in claim 76, wherein the micro-scaled regions comprise micro-pillars.

88. The device in claim 87, wherein the micro-pillars comprise a plurality of pins, wherein at least one of the plurality of pins has a cross sectional area within a range of and including 10 $(micron)^2$ and 100 $(micron)^2$.

89. The device in claim 88, wherein at least one of the plurality of pins has a height dimension within a range of and including 50 microns and 2.0 millimeters.

90. The device in claim 88, wherein at least two of the plurality of pins are separated from each other by a spacing dimension within a range of and including 10 microns to 150 microns.

91. The device in claim 76, wherein the micro-scaled regions comprise any one of microchannels, a micro-porous structure, and micro-pillars.

* * * * *

UNITED STATES PATENT AND TRADEMARK OFFICE
CERTIFICATE OF CORRECTION

PATENT NO. : 7,806,168 B2  Page 1 of 1
APPLICATION NO. : 10/698180
DATED : October 5, 2010
INVENTOR(S) : Girish Upadhya et al.

It is certified that error appears in the above-identified patent and that said Letters Patent is hereby corrected as shown below:

At column 10, line 4, Claim 4, please replace "the" with -- a -- so that the corresponding phrase reads -- in a range of --.

At column 10, line 10, Claim 6, please replace "and," with -- and -- so that the corresponding phrase reads -- within a range of and including --.

At column 10, line 34, Claim 14, please replace "Cross" with -- cross -- so that the corresponding phrase reads -- a cross sectional area --.

At column 10, line 38, Claim 15, please replace "and2.0" with -- and 2.0 -- so that the corresponding phrase reads -- including 50 microns and 2.0 millimeters --.

Signed and Sealed this

Thirtieth Day of November, 2010

David J. Kappos
*Director of the United States Patent and Trademark Office*